United States Patent
Evans et al.

(10) Patent No.: US 10,847,372 B2
(45) Date of Patent: Nov. 24, 2020

(54) WORKPIECE PROCESSING TECHNIQUE

(71) Applicant: Varian Semiconductor Equipment Associates, Inc., Gloucester, MA (US)

(72) Inventors: Morgan D. Evans, Manchester, MA (US); Kevin Anglin, Somerville, MA (US); Ross Bandy, Milton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/142,458

(22) Filed: Sep. 26, 2018

(65) Prior Publication Data
US 2019/0027367 A1    Jan. 24, 2019

Related U.S. Application Data

(63) Continuation of application No. 14/788,306, filed on Jun. 30, 2015, now abandoned.

(51) Int. Cl.
*G01N 23/00* (2006.01)
*H01L 21/285* (2006.01)
*H01L 21/66* (2006.01)

(52) U.S. Cl.
CPC ........ *H01L 21/28506* (2013.01); *H01L 22/12* (2013.01); *H01L 22/20* (2013.01);
(Continued)

(58) Field of Classification Search
CPC ......... H01L 22/12; H01L 22/20; H01L 22/26; H01L 21/306; H01L 21/3065;
(Continued)

(56) References Cited

U.S. PATENT DOCUMENTS

| 5,525,806 A | 6/1996 | Iwasaki et al. |
| 6,852,984 B2 | 2/2005 | Krueger |

(Continued)

FOREIGN PATENT DOCUMENTS

| JP | 8-153691 A | 6/1996 |
| JP | 2006-344931 A | 12/2006 |

(Continued)

OTHER PUBLICATIONS

Webster's Ninth New Collegiate Dictionary; Merriam-Webster Inc., publishers; Springfield, Massachusetts, USA; 1990 (no month); excerpt pp. 1000.*

(Continued)

*Primary Examiner* — Marianne L Padgett
(74) *Attorney, Agent, or Firm* — Nields, Lemack & Frame, LLC

(57) ABSTRACT

Methods for processing of a workpiece are disclosed. The actual rate at which different portions of an ion beam can process a workpiece, referred to as the processing rate profile, is determined by measuring the amount of material removed from, or added to, a workpiece by the ion beam as a function of ion beam position. An initial thickness profile of a workpiece to be processed is determined. Based on the initial thickness profile, a target thickness profile, and the processing rate profile of the ion beam, a first set of processing parameters are determined. The workpiece is then processed using this first set of processing parameters. In some embodiments, an updated thickness profile is determined after the first process and a second set of processing parameters are determined. A second process is performed using the second set of processing parameters. Optimizations to improve throughput are also disclosed.

18 Claims, 5 Drawing Sheets

(52) U.S. Cl.
CPC ........... *H01J 2237/30433* (2013.01); *H01J 2237/30472* (2013.01); *H01J 2237/31* (2013.01); *H01J 2237/3151* (2013.01)

(58) Field of Classification Search
CPC ...... H01L 21/32131; H01J 37/3005–31; H01J 37/304; H01J 37/347; H01J 2237/30433; H01J 2237/30472; H01J 2237/30455; H01J 2237/30461; H01J 2237/31–31713; H01J 2237/3174; H01J 2237/31744
USPC .......... 427/9, 523, 533, 534; 216/59, 60, 66, 216/94; 438/14, 16, 712, 766, 798; 204/192.13, 192.25, 192.33–192.37
See application file for complete search history.

(56) References Cited

U.S. PATENT DOCUMENTS

| | | | |
|---|---|---|---|
| 6,965,116 B1 | 11/2005 | Wagner et al. | |
| 7,176,470 B1 | 2/2007 | Evans et al. | |
| 7,355,188 B2 | 4/2008 | Olson et al. | |
| 7,394,073 B2 | 7/2008 | Cummings et al. | |
| 7,683,348 B2 | 3/2010 | Lee et al. | |
| 8,853,653 B1 | 10/2014 | Todorov et al. | |
| 9,336,998 B2* | 5/2016 | Godet | H01J 37/3299 |
| 9,711,328 B2* | 7/2017 | Satoh | H01J 37/304 |
| 10,002,764 B1 | 6/2018 | Anglin et al. | |
| 10,081,861 B2* | 9/2018 | Evans | C23C 14/221 |
| 10,090,166 B2* | 10/2018 | Waite | H01L 21/76224 |
| 10,222,202 B2* | 3/2019 | Evans | G03F 7/70625 |
| 10,483,086 B2* | 11/2019 | Ray | H01J 37/304 |
| 10,553,392 B1* | 2/2020 | Eisner | H01J 37/3171 |
| 10,553,448 B2* | 2/2020 | Ma | H01L 21/32131 |
| 10,600,675 B2* | 3/2020 | Waite | H01L 21/31116 |
| 10,699,871 B2* | 6/2020 | Shu | H01J 37/3005 |
| 2002/0134948 A1 | 9/2002 | Olson et al. | |
| 2004/0149926 A1 | 8/2004 | Purser et al. | |
| 2005/0191409 A1 | 9/2005 | Murrell et al. | |
| 2006/0088655 A1 | 4/2006 | Collins et al. | |
| 2006/0097195 A1 | 5/2006 | Angel et al. | |
| 2006/0144335 A1 | 7/2006 | Lee et al. | |
| 2006/0246211 A1 | 11/2006 | Sakai | |
| 2006/0284114 A1 | 12/2006 | Olson et al. | |
| 2007/0090091 A1* | 4/2007 | Adomaitis | C23C 14/542 216/59 |
| 2008/0073550 A1 | 3/2008 | Gupta et al. | |
| 2008/0179284 A1 | 7/2008 | Hayes et al. | |
| 2008/0237491 A1* | 10/2008 | Caliendo | H01L 22/20 250/492.3 |
| 2009/0001282 A1 | 1/2009 | Hofmeester et al. | |
| 2009/0084757 A1 | 4/2009 | Erokhin et al. | |
| 2009/0242808 A1 | 10/2009 | Evans | |
| 2010/0200774 A1 | 8/2010 | Burke et al. | |
| 2011/0029117 A1 | 2/2011 | Tsuji | |
| 2012/0190135 A1 | 7/2012 | Ito et al. | |
| 2012/0196047 A1 | 8/2012 | Shen et al. | |
| 2012/0276658 A1 | 11/2012 | Godet et al. | |
| 2013/0023067 A1 | 1/2013 | Absil et al. | |
| 2014/0261171 A1 | 9/2014 | Hahto et al. | |
| 2015/0115156 A1 | 4/2015 | Suzuki et al. | |
| 2015/0179531 A1 | 6/2015 | Wu et al. | |
| 2016/0189926 A1 | 6/2016 | Ray et al. | |
| 2016/0189927 A1* | 6/2016 | Satoh | H01J 37/3045 250/492.21 |
| 2016/0298229 A1 | 10/2016 | Evans et al. | |
| 2018/0068828 A1 | 3/2018 | Hailing | |
| 2018/0122650 A1 | 5/2018 | Ma et al. | |
| 2019/0027396 A1* | 1/2019 | Waite | H01L 21/7624 |
| 2020/0133144 A1* | 4/2020 | Schmitt-Weaver | G03F 9/7092 |
| 2020/0194221 A1* | 6/2020 | Eisner | H01J 37/153 |

FOREIGN PATENT DOCUMENTS

| | | |
|---|---|---|
| JP | 2008/98232 A | 4/2008 |
| JP | 2009-253133 A | 10/2009 |
| JP | 2010-519710 A | 6/2010 |
| JP | 2012-156243 A | 8/2012 |
| WO | 2008/106448 A2 | 9/2008 |

OTHER PUBLICATIONS

N.R. White et al.; "The Control of Uniformity in Parallel Ribbon Ion Beams up to 24 Inches in Size"; editors J.L. Duggan et al. Applications of Accelerators in Research and industry; 1999 (no month), pp. 830-835.*

International Search Report and Written Opinion dated Sep. 30, 2016 in corresponding PCT application No. PCT/US2016/039259.

Office action dated Mar. 9, 2017 in co-pending U.S. Appl. No. 14/788,306.

Final rejection dated Aug. 7, 2017 in co-pending U.S. Appl. No. 14/788,306.

Office action dated Jan. 2, 2018 in co-pending U.S. Appl. No. 14/788,306.

Final rejection dated Jul. 5, 2018 in co-pending U.S. Appl. No. 14/788,306.

* cited by examiner

WORKPIECE PROCESSING TECHNIQUE

This application is a continuation of U.S. patent application Ser. No. 14/788,306 filed Jun. 30, 2015, the disclosure of which is incorporated herein by reference in its entirety.

Embodiments of the present disclosure relate to a method of selectively processing a workpiece, and more particularly, to selectively performing an etch, deposition or amorphization process on a semiconductor workpiece.

BACKGROUND

Improvement in yields for semiconductor devices is a continuous goal. One area that may be improved is uniformity control across the workpiece. In certain processes, the workpiece may receive more treatment in one region, such as near the center of the workpiece, than in other regions.

For example, a deposition process may deposit more material near the center of a workpiece than near the outer edge of that workpiece. This may be due to the increased plasma density near the center of the deposition chamber.

In another example, a spin coating process may leave more material near the outer edge of the workpiece, as compared to the center of the workpiece. This may be due to the centripetal force pushing the coating toward the outer edge of the workpiece.

In each of these examples, this process non-uniformity may negatively impact the yield of a semiconductor workpiece. In some cases, efforts are made to improve the uniformity of the process. However, there may be limits to the degree of uniformity that may be achieved.

For example, the ion beam used to process the semiconductor workpiece to correct this non-uniformity may itself be non-uniform. This non-uniformity of the ion beam may result in different processing rates of the workpiece. There are some techniques that may be used to attempt to measure and quantify or correct the uniformity of an ion beam. However, the granularity of such tools may not be sufficient for these selective area processes. Further, the process may not be directly related to ion beam current. For example, the background gas levels of species, such as oxygen, may change the etch, amorphization or deposition rates. Therefore, it would be beneficial if there were a method of more precisely quantifying the rate at which different portions of an ion beam can process a workpiece, and using this information to subsequently process one or more workpieces. Further, it would be advantageous if this quantification did not affect the throughput of the processing equipment.

SUMMARY

Methods for processing of a workpiece are disclosed. The actual rate at which different portions of an ion beam can process a workpiece, referred to as the processing rate profile, is determined by measuring the amount of material removed from, or added to, a workpiece by the ion beam as a function of ion beam position. Subsequently, an initial thickness profile of a workpiece to be processed is determined. Based on the initial thickness profile, a target thickness profile, and the processing rate profile of the ion beam, a first set of processing parameters are determined. The workpiece is then processed using this first set of processing parameters. In some embodiments, an updated thickness profile is determined after the first process and a second set of processing parameters are determined based on the updated thickness profile, the target thickness profile and the processing rate profile of the ion beam. A second process is performed using the second set of processing parameters. Optimizations to improve throughput are also disclosed.

According to one embodiment, a method of processing a workpiece is disclosed. The method comprises measuring an initial thickness profile of a first workpiece; directing an ion beam toward the first workpiece for a predetermined time or dose; measuring an updated thickness profile of the first workpiece after the directing; determining an etch rate profile of the ion beam as a function of ion beam position based on a difference between the initial thickness profile and the updated thickness profile; and processing a second workpiece based on the etch rate profile of the ion beam. In some embodiments, the processing of the second workpiece is performed using a plurality of passes, wherein the ion beam is scanned across the second workpiece during each pass, wherein the etch rate profile is used to determine a first set of processing parameters that are selected from the group consisting of a number of passes, and operating parameters used during each pass. The operating parameters may be selected from the group consisting of a scan speed profile, a duty cycle of the ion beam, an extraction current or voltage, and a pressure of a feed gas. In certain embodiments, the initial thickness profile and the updated thickness profile are measured using a reflectometer. The processing of the second workpiece may comprise an etch process, a deposition process or an amorphization process.

According to a second embodiment, a method of processing a workpiece is disclosed. The method comprises determining a processing rate profile of an ion beam as a function of ion beam position; determining an initial thickness profile of the workpiece; using the processing rate profile, the initial thickness profile and a target thickness profile to calculate a first set of processing parameters; and processing the workpiece using the first set of processing parameters. In certain embodiments, the method further comprises determining an updated thickness profile of the workpiece after the processing; using the processing rate profile, the updated thickness profile and the target thickness profile to calculate a second set of processing parameters; and processing the workpiece using the second set of processing parameters. In some embodiments, the processing rate profile is determined by measuring an initial thickness profile of a sacrificial workpiece; directing the ion beam toward the sacrificial workpiece for a predetermined time or dose; measuring an updated thickness profile of the sacrificial workpiece after the directing; and determining the processing rate profile based on a difference between the initial thickness profile and the updated thickness profile. In certain embodiments, the processing rate profile comprises an etch rate profile. In other embodiments, the processing rate profile comprises a deposition rate profile.

According to a third embodiment, a method of processing a plurality of workpieces from a lot is disclosed. The method comprises determining an etch rate profile of an ion beam as a function of ion beam position using a sacrificial workpiece; determining an initial thickness profile of a first workpiece of the lot; using the etch rate profile, the initial thickness profile of the first workpiece and a target thickness profile to calculate a first set of processing parameters; processing the first workpiece of the lot using the first set of processing parameters; and processing a second workpiece of the lot using the first set of processing parameters. In certain embodiments, the method further comprises, before processing the second workpiece, determining an updated thickness profile of the first workpiece of the lot after the processing of the first workpiece; using the etch rate profile, the updated thickness profile of the first workpiece and the target thickness profile to calculate a second set of processing parameters for the first workpiece; and processing the first workpiece of the lot using the second set of processing parameters for the first workpiece. In certain embodiments, the method further comprises determining an updated thickness profile of the second workpiece of the lot after processing the second workpiece; using the etch rate profile, the updated thickness profile of the second workpiece and the target thickness profile to calculate a second set of processing parameters for the second workpiece; and processing the second workpiece of the lot using the second set of processing parameters for the second workpiece.

BRIEF DESCRIPTION OF THE FIGURES

For a better understanding of the present disclosure, reference is made to the accompanying drawings, which are incorporated herein by reference and in which.

DETAILED DESCRIPTION

As described above, processes are often non-uniform, leading to different characteristics across the semiconductor workpiece. Further, in certain processes, elimination of this non-uniformity may be difficult. For example, deposition processes may deposit more material on certain portions of a workpiece, such as near the center, due to increased plasma density in this region. Creation of a plasma that is completely uniform across the workpiece may be challenging.

In certain embodiments, the uniformity of the workpiece may be improved by performing a selective process. For example, it may be desirable to create a workpiece that has a thickness that is constant across the workpiece to within a predetermined tolerance. To achieve this, a workpiece having a known thickness profile may be subjected to a selective etching process to remove material from the workpiece until the thickness across the workpiece is within a predetermined tolerance. In other embodiments, the uniformity of the workpiece may be improved by performing a selective deposition process, or a selective amorphization process.

Ion beams are often used to perform these processes. In the case of an etching process, exposure of a workpiece to an ion beam of a particular species may remove material from the workpiece. However, the rate at which the material is removed, also referred to as etch rate, may vary across the workpiece. This may be due to a number of factors. For example, the etch rate is related to the ion beam current; however, the ion beam itself may not be uniform. Regions of the workpiece that are exposed to higher current portions of the ion beam may be etched at a higher rate than other regions. Further, the etch rate may also be a function of the composition of the workpiece and the species used to create the ion beam. Other factors may also affect the etch rate of a workpiece. For example, the background gas levels of species, such as oxygen, may change the etch rate. Similarly, the deposition and amorphization rates may also vary based on ion beam current, the species that is being deposited and other factors.

Figure 1:
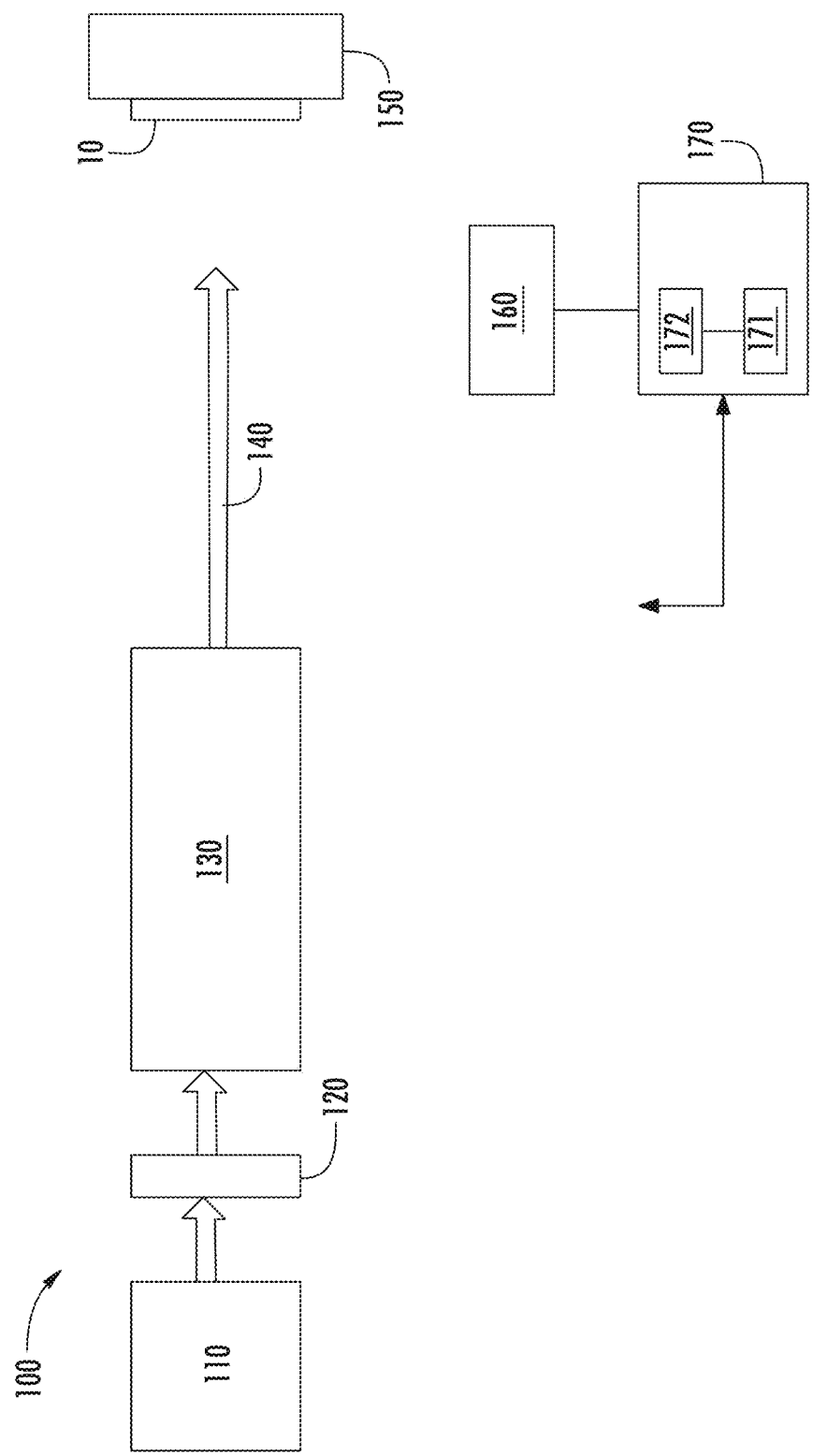
FIG. 1 is a representative ion implantation system.

FIG. 1 shows an illustrative schematic of an ion implanter 100. The ion implanter 100 includes an ion source 110, which is used to create ions from one or more feed gasses. Ions are extracted from the ion source 110, typically through the use of electrically biased electrodes 120 disposed proximate an extraction aperture on the ion source 110. The extracted ions are then manipulated by a series of beam line components 130, which shape and focus the ion beam 140. The beam line components may include accelerators, decelerators, mass analyzers and collimating magnets. The ion beam 140 may be a ribbon beam, where one dimension of the ion beam 140 is much greater than the other dimension. In another embodiment, the ion beam 140 may be a spot beam, which may be nearly circular in shape.

The ion beam 140 is then directed toward a workpiece 10, which may be clamped to a platen 150. The platen 150 may be capable of movement in the horizontal, vertical and rotational directions.

To process the workpiece 10, the ion beam 140 may be directed toward the workpiece 10. The platen 150 may then be translated in multiple directions to allow the ion beam 140 to impact the various regions of the workpiece 10.

An optical system, such as a reflectometer 160, may be used to determine thickness of workpieces 10. Information from the reflectometer 160 may be used by a controller 170 to adjust the parameters of the ion source 110, or the platen 150. The controller 170 includes a processing unit 171 used in conjunction with a storage element 172. The storage element 172 may contain non-transitory media that is used to store instructions that may be executed by the processing unit 171. Thus, the controller 170 may be capable of performing the sequences described herein.

In certain embodiments, material is removed from a workpiece to create a workpiece having the targeted thickness profile. In this embodiment, ion implanter 100 may be used to selectively remove material from the workpiece 10. The determination of the amount of material that is to be removed from the workpiece 10 may be made by the controller 170, based on the initial thickness profile of the workpiece 10 and the target thickness profile. The initial thickness profile of the workpiece 10 may be determined using the reflectometer 160. The target thickness profile may be a known quantity that is input to the controller 170. This calculation results in a three dimensional map, where each location on the workpiece is represented in two dimensions, such as (x,y), and the thickness to be deposited or removed from that location is the value at that location. This matrix may be referred to as the material modification matrix and may be stored in the storage element 172 of the controller 170. In the case of an etching process, this matrix may represent the amount of material to be removed from each location on the workpiece. Alternatively, in the case of a deposition process, this matrix may represent the amount of material to be deposited on each location on the workpiece.

The actual etch rate of the material as a function of ion beam position may be used on conjunction with the material modification matrix by the controller 170 to determine the processing parameters that are to be used to process the workpiece 10. For example, during the processing, the workpiece 10 may be subjected to a plurality of passes of the ion beam 140. During each pass, the ion beam 140 scans the entire workpiece 10 or a portion thereof. The speed of the platen 150 relative to the ion beam 140 may vary during the scan to allow certain portions of the workpiece 10 to be processed more than other portions. In certain embodiments, multiple passes are performed. For example, a first pass may be performed by moving the ion beam 140 from the top of the workpiece 10 to the bottom of the workpiece 10 in a vertical direction. After this first pass is completed, the workpiece may be rotated by 360/N degrees by the platen 150, where N is the number of passes that are to be performed. After the rotation is complete, the ion beam 140 may again scan from the top of the workpiece 10 to the bottom of the workpiece 10, or from the bottom of the workpiece 10 to the top of the workpiece 10. This is repeated until all N passes are performed. As noted above, the speed of each pass may vary. Additionally, or alternatively, the beam current may be modified by varying the duty cycle of the ion beam, or the extraction current or voltage. Additionally or alternatively, another operating parameter, such as pressure of the feed gas, or distance between the platen and the ion source, may vary for each pass and/or rotation. Further, the speed and other operating parameters may vary during each individual pass. The number of passes, and the scan speed profile during each pass and the other operating parameters used during each pass may be determined by the controller 170.

Calculating a etch rate may be done indirectly. For example, the beam current of the ion beam can be determined and this value can be used to determine the expected etch rate. In the present disclosure, the rate at which the workpiece is processed due to the ion beam, also referred to as processing rate profile, is measured directly.

Figure 2:
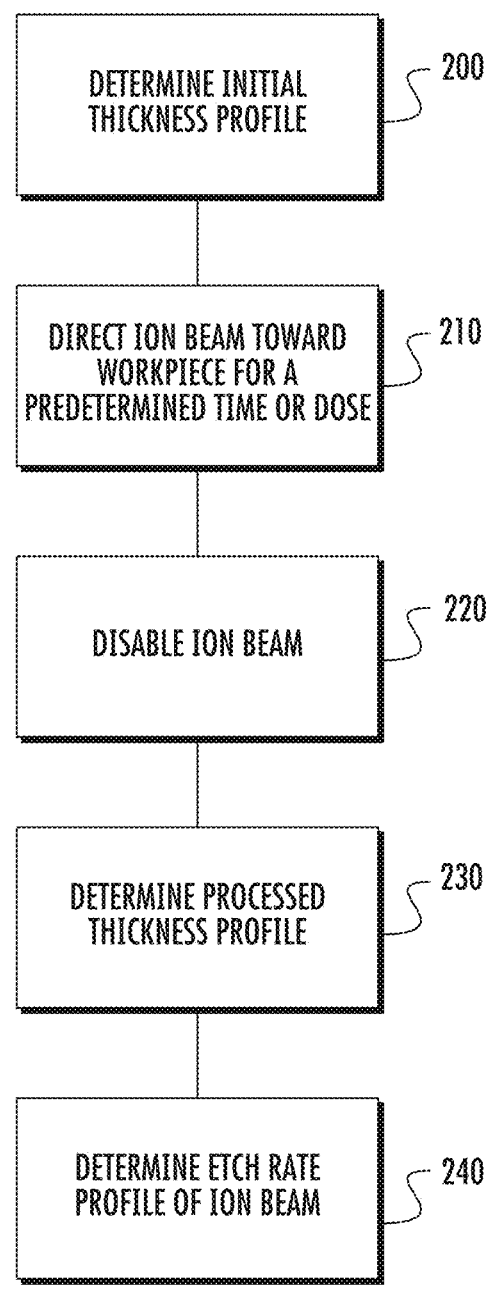
FIG. 2 shows a flowchart that may be used to determine processing rate profile of an ion beam.

FIG. 2 shows a process that may be used to determine the actual etch rate profile of an ion beam as a function of ion beam position. This process may be performed using controller 170, or may use a different controller. First, as shown in Process 200, the thickness profile of the workpiece 10 is determined. This may be performed using the reflectometer 160, which scans across the workpiece 10. Based on the time difference between the transmitted light and the reflected light, the initial thickness profile of the workpiece 10 may be determined. The reflectometer 160 may be used to determine the thickness of the workpiece 10 at a plurality of locations. For example, in one embodiment, a thickness measurement may be performed every 0.5 mm in both directions. This yields a three dimensional array, defined as the two dimensional position on the workpiece and the thickness of the workpiece at that two dimensional location.

Then, as shown in Process 210, the ion beam 140 is then directed toward the workpiece 10. During this time, the ion beam 140 is not scanned relative to the workpiece 10. Rather, the ion beam 140 remains stationary relative to the workpiece 10 for a predetermined time or a predetermined dose. After the predetermined time or dose, the ion beam 140 is disabled, as shown in Process 220. In Process 230, the thickness profile of this processed workpiece is then determined, using the technique described above in Process 200.

Figure 3:
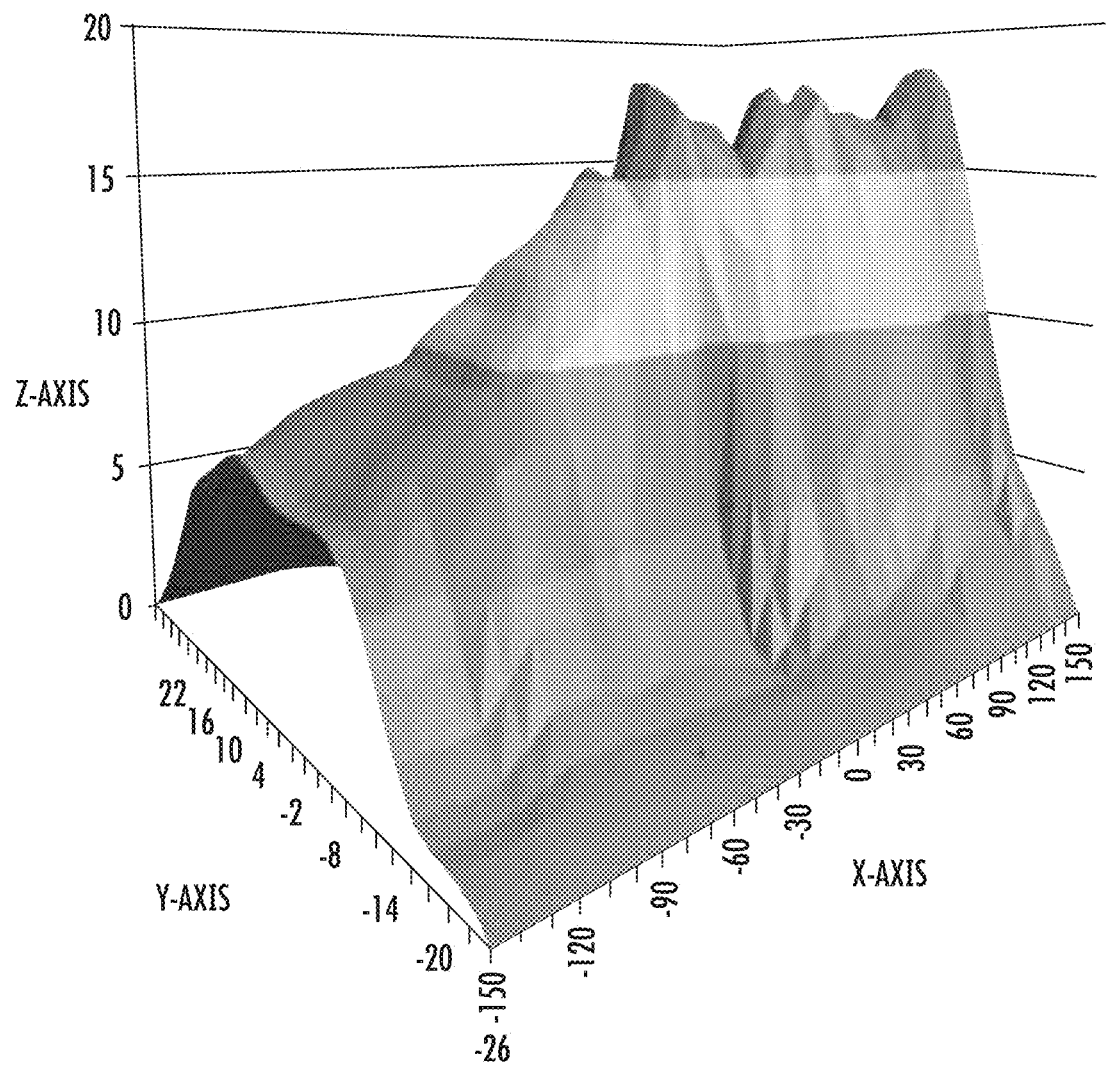
FIG. 3 is a representative etch rate profile calculated using the sequence shown in FIG. 2.

The processed thickness profile is then subtracted from the initial thickness profile to yield the actual etch rate profile, as shown in Process 240. Thus, the etch rate profile is determined based on the difference between the initial thickness profile and the processed thickness profile. An example of an actual etch rate profile is shown in FIG. 3. This figure shows the effect of the ion beam 140, as a function of ion beam position, on the workpiece 10. The x-axis is along the long dimension of the ion beam 140, which may be a ribbon beam, and is referenced to the center of the ion beam 140. Thus, the x-axis is centered at 0. The y-axis is along the short dimension of the ribbon beam and is similarly referenced to the center of the ion beam 140. The z-axis is indicative of the amount of material removed from the workpiece 10 by the ion beam 140 during Process 210. In certain embodiments, the z-axis represents the actual amount of material, measured in angstroms, that was removed from the workpiece 10 in Process 210. In other embodiments, the z-axis may represent an etch rate, measured in thickness per unit time, or angstroms/sec. For example, the z-axis may represent the actual amount of material removed, measured in angstroms, divided by the predetermined time used in Process 210.

Note that the ion beam 140 creates a non-uniform pattern in the workpiece 10. For example, in this example, the center of the ion beam 140, referred to as (0,0) in FIG. 3, etches far more material from the workpiece 10 than other portions of the ion beam 140. The profile of FIG. 3 may be generated by taking a plurality of scans using a reflectometer, where each scan may be performed 0.5 mm from the previous scan. This plurality of scans is then processed to form the etch rate profile shown in FIG. 3.

Figure 4:
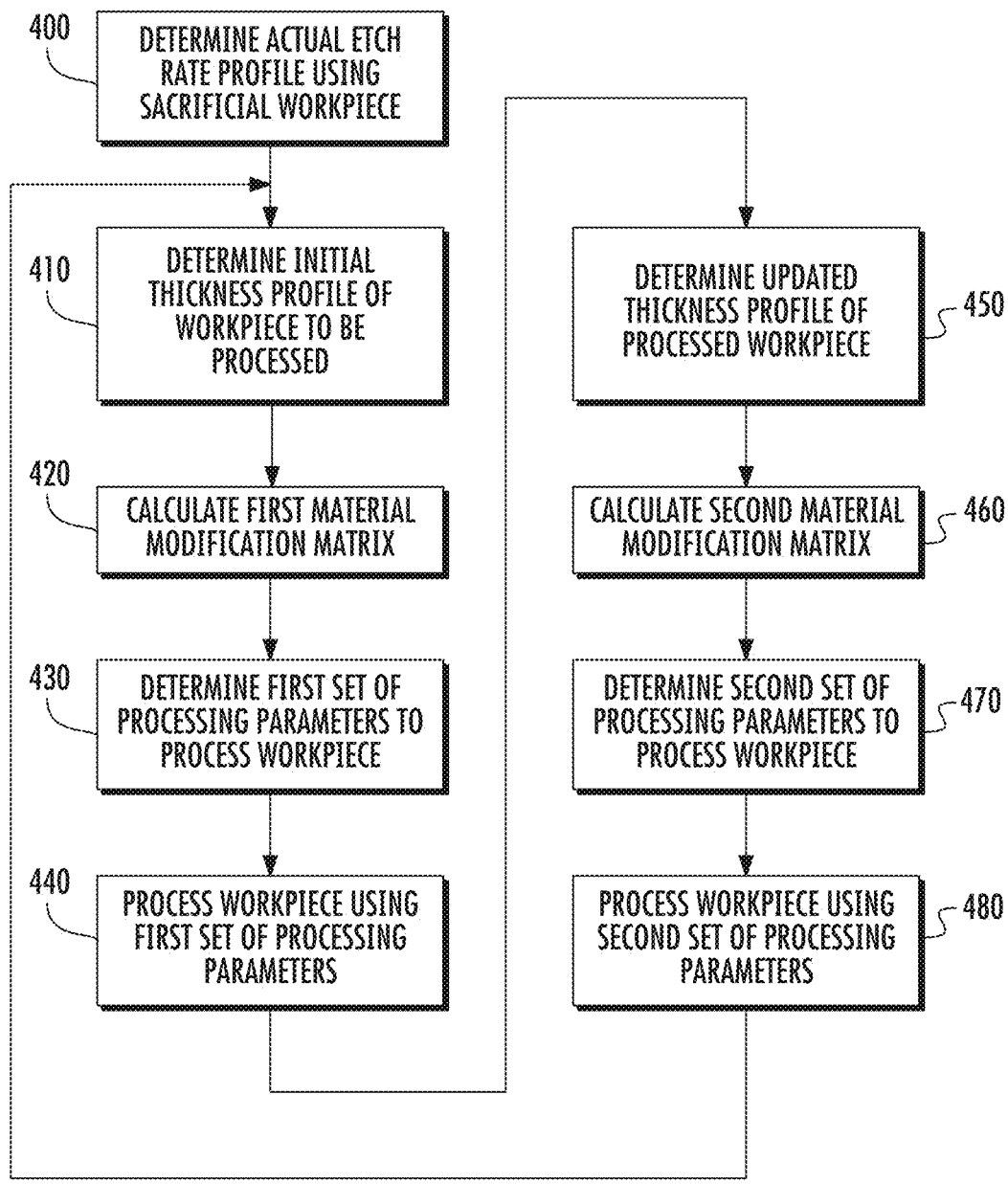
FIG. 4 shows a flowchart that may be used to process a workpiece.

If the actual etch rate of the ion beam, as a function of ion beam position, is known, selective processing of a workpiece may be performed. FIG. 4 shows a processing sequence that may be used to selectively process a workpiece. This process may be performed using controller 170. First, as shown in Process 400, the actual etch rate profile of the ion beam is determined empirically using a sacrificial workpiece. In other embodiments, the actual etch rate profile is determined using the workpiece to be processed. This may be done using the sequence shown in FIG. 2.

Next, the initial thickness profile of a workpiece 10 to be processed is measured, as shown in Process 410. Based on this initial thickness profile and the target thickness profile (which may be input to the controller 170), a first material modification matrix may be generated, as shown in Process 420. As described above, the first material modification matrix is the difference between the initial thickness profile of the workpiece 10 and the target thickness profile. This first material modification matrix may be stored in the storage element 172. The first material modification matrix is used to determine the amount of material to remove or deposit to each location on the workpiece 10.

Based on the first material modification matrix and the actual etch rate profile of the ion beam, a first set of processing parameters may be determined by the controller 170, as shown in Process 430. This first set of processing parameters includes the number of passes that are to be performed, as well as the scan speed profile and operating parameters to be used during each pass. For example, if the first material modification matrix indicates that more material is to be removed in a specific region of the workpiece, one or more of the passes may slow the scan speed when this region of the workpiece is exposed to the ion beam 140 to allow more processing of this region. Similarly, regions where little material is to be removed may be lightly processed by scanning the ion beam more quickly over these regions. Alternatively, or additionally, the duty cycle, extraction current or voltage or other operating parameters may be varied to allow selective processing of the workpiece.

The workpiece 10 is then processed using this first set of processing parameters, as shown in Process 440. In certain embodiments, this processing may comprise an etching process. After this etching is completed, an updated thickness profile of the processed workpiece is then measured using the reflectometer 160, as shown in Process 450.

This updated thickness profile is then compared to the target thickness profile to generate a second material modification matrix, as shown in Process 460. As before, this second material modification matrix may be stored in the storage element 172. The controller 170 then calculates the second set of processing parameters based on the second material modification matrix, as shown in Process 470. As shown in Process 480, the workpiece 10 is then subjected to a second processing using the second set of process parameters determined in Process 470. Following Process 480, the workpiece 10 may have a thickness profile that is similar to the target thickness profile, and may be removed from the platen 150. A new workpiece may be placed on the platen 150 and Processes 410-480 may be repeated for this new workpiece.

While FIG. 4 shows the workpiece 10 being subjected to two processes, other embodiments are also possible. For example, in certain embodiments, Processes 450-480 may be repeated multiple times for each workpiece to achieve improved results. In other words, the thickness profile of the processed workpiece may be measured a plurality of times, an updated material modification matrix may be generated based on each measured thickness profile, and the workpiece may be processed based on each updated material modification matrix.

In other embodiments, after Process 440 has been completed, the thickness profile of the workpiece 10 may be sufficiently close to the target thickness profile. In these embodiments, Processes 450-480 may not be performed and the workpiece 10 may be removed from the platen 150 after Process 440 is completed. In this embodiment, each workpiece may only undergo Processes 410-440.

While FIG. 4 is described as using an etching process, other embodiments are also possible. For example, the etch rate profile determined in Process 400 may also be indicative of the deposition or amorphization rate profiles of the ion beam. Thus, the sequence shown in FIG. 2 may be used to create an etch rate profile, such as that shown in FIG. 3, which may then be used for subsequent deposition or amorphization processes. Thus, Process 440 and Process 480 may be deposition or amorphization processes in certain embodiments.

Further, the sequence shown in FIG. 2 may be modified, in the case of deposition. For example, rather than directing an ion beam that comprises an etching species toward the workpiece, the ion beam may comprise a deposition species. In this embodiment, rather than removing material from the workpiece, the ion beam deposits material. The difference between the initial thickness profile, as determined in Process 200, and the processed thickness profile, determined in Process 230, would be the amount of material deposited on the workpiece as a function of ion beam location. Thus, Process 240 would be used to determine a deposition rate profile for the ion beam. In this embodiment, this deposition rate profile may then be determined in Process 400 and used throughout the sequence shown in FIG. 4. In the present disclosure, the rate at which the workpiece is processed due to the ion beam, either via etching or deposition, may be referred to as the processing rate profile. As described above, in embodiments where an etching process is performed during the sequence of FIG. 2, the processing rate profile is an etch rate profile. In embodiments where a deposition process is performed during the sequence of FIG. 2, the processing rate profile is a deposition rate profile.

FIG. 4 shows one sequence that may yield a workpiece having a thickness profile that is sufficiently close to a target thickness profile. However, to improve throughput, modifications to this sequence may be made. For example, workpieces are often processed in lots. All of the workpieces within a given lot may have properties that are very similar to one another. For example, the initial thickness profile of all workpieces in a single lot may be very similar to one another. This may be used to optimize the process of FIG. 4.

Figure 5:
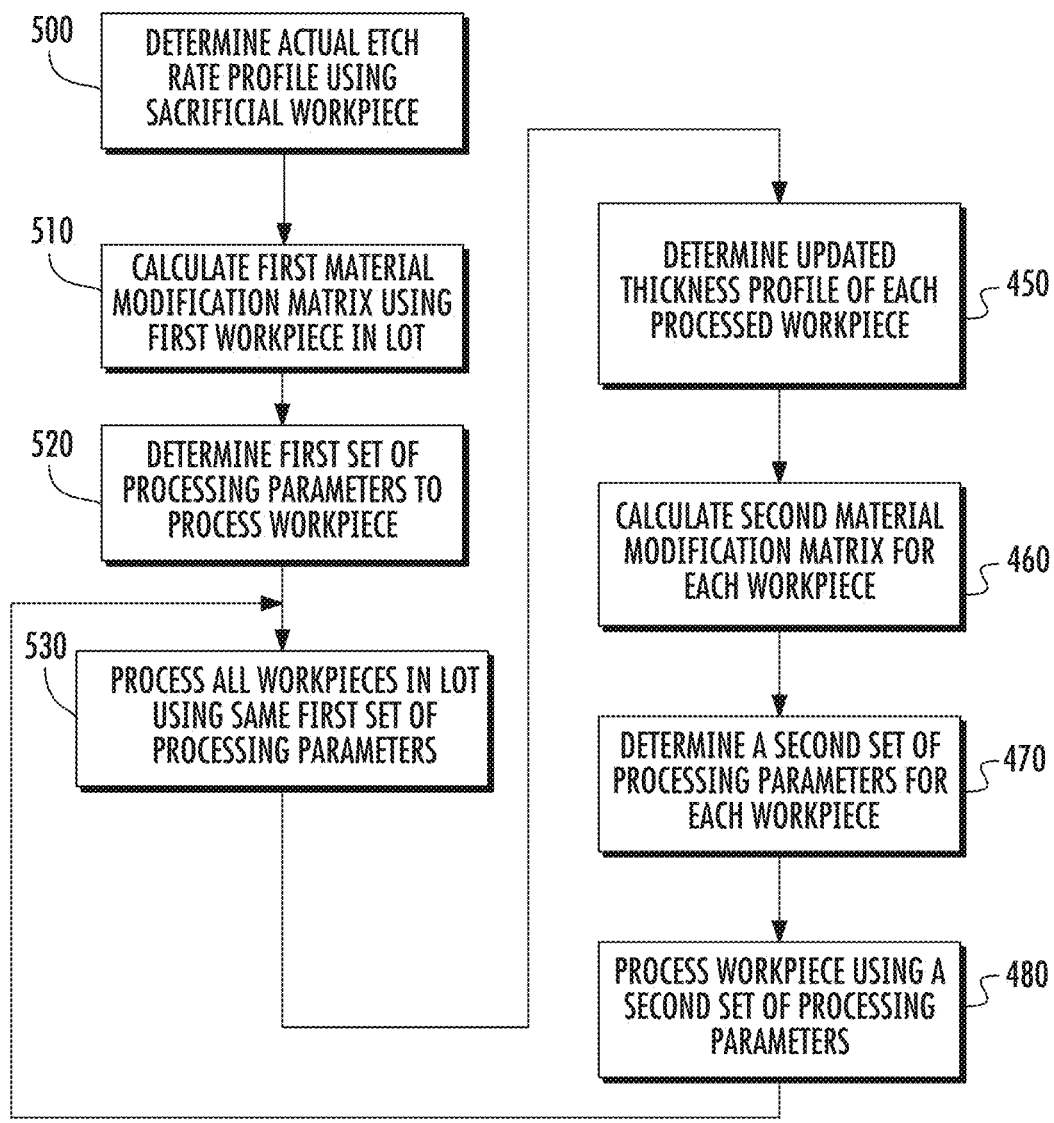
FIG. 5 shows a flowchart that may be used to process a lot of workpieces.

FIG. 5 shows one such optimization. In this sequence, the actual etch rate profile of the ion beam 140 is determined using a sacrificial workpiece, as shown in Process 500. In other embodiments, the actual etch rate profile is determined using a workpiece to be processed. As described above, in certain embodiments, a deposition rate profile may be determined in Process 500. Next, the initial thickness profile of the first workpiece of the lot is determined using the reflectometer 160. This information is used to create a first material modification matrix, as shown in Process 510, which may be stored in storage element 172. This first material modification matrix is then used by the controller 170 to determine the first set of processing parameters as shown in Process 520. Then, this first set of processing parameters is used to process this first workpiece, as shown in Process 530. After this process is completed, the workpiece is fabricated in accordance with Processes 450-480 of FIG. 4. In other words, the updated thickness profile of the processed workpiece is determined, as shown in Process 450. The second material modification matrix is calculated, as shown in Process 460, and is used to determine the second set of processing parameters, as shown in Process 470. Finally, the workpiece is processed using the second set of processing parameters as shown in Process 480. The workpiece is then removed from the platen and a new workpiece from that lot is introduced.

In this embodiment, unlike that of FIG. 4, processes 510-520 are not performed for the subsequent workpieces of the same lot. Rather, it is assumed that the initial thickness profile of each workpiece in a lot is sufficiently similar so that the first workpiece can be used as the thickness model for all workpieces in that lot. Thus, all of the workpieces of the lot are processed using the same first set of processing parameters. However, in certain embodiments, each workpiece from that lot is processed using a unique second set of processing parameters which are determined based on the updated thickness profile of that particular workpiece. In other embodiments, each workpiece from that lot is processed using the same second set of processing parameters that were determined based on the first workpiece in the lot.

Another optimization to the sequence shown in FIG. 5 is also possible. In certain embodiments, the thickness profile of the workpieces following Process 530 may be sufficiently close to the target thickness profile that additional processing may not be required. In these embodiments, the workpiece may be removed from the platen after Process 530 and a new workpiece may be placed on the platen. In this embodiment, Processes 510-530 are performed for the first workpiece of a lot, but only Process 530 is performed for the subsequent workpieces of that lot. This sequence may represent the maximum throughput that may be achieved.

The embodiments described above in the present application may have many advantages. As described above, ion beams typically display non-uniformity in terms of beam current. This non-uniformity affects the processing rate profile that is actually achieved by different portions of the ion beam. By measuring the actual processing rate profile of the ion beam as a function of ion beam position, improved processing of workpieces may be achieved. Specifically, it may be possible to etch workpieces having various thickness profiles such that the workpiece, after processing, is uniformly thick, such as within 25 angstroms. Additionally, this technique may be applied to other processes, such as deposition and amorphization. In addition, the present technique measures the actual processing rate profile, and therefore may be more accurate than other methods which measure ion beam current and interpolate etch rate profile from that measurement.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of etching a first workpiece, comprising:
   determining an etch rate profile of a ribbon ion beam as a function of ion beam position using a sacrificial workpiece, wherein the etch rate profile is determined by:
   measuring an initial thickness profile of the sacrificial workpiece, the initial thickness profile comprising initial thickness measurements at a plurality of locations extending in two perpendicular directions so as to yield a three dimensional array, wherein each location of the plurality of locations is a two-dimensional position on the sacrificial workpiece;
   directing the ribbon ion beam toward the sacrificial workpiece for a predetermined time or dose while the ribbon ion beam remains stationary relative to the sacrificial workpiece;
   measuring an updated thickness profile of the sacrificial workpiece after the directing, the updated thickness profile comprising updated thickness measurements at the plurality of locations; and
   determining the etch rate profile of the ribbon ion beam, wherein the etch rate profile of the ribbon ion beam is non-uniform and is calculated as a difference between the initial thickness profile and the updated thickness profile at each said two-dimensional position; and
   etching the first workpiece using the etch rate profile of the ribbon ion beam to achieve a target thickness profile.

2. The method of claim 1, wherein the etching of the first workpiece is performed using a plurality of passes, wherein the ribbon ion beam is scanned across an entirety of a surface of the first workpiece during each pass of the plurality of passes, wherein the etch rate profile is used to determine a first set of processing parameters that are selected from the group consisting of a number of the plurality of passes, and operating parameters used during each pass.

3. The method of claim 2, wherein the etch rate profile is used to determine the operating parameters and the operating parameters are selected from the group consisting of a scan speed profile, a duty cycle of the ribbon ion beam, an extraction current, an extraction voltage, and a pressure of a feed gas.

4. The method of claim 2, wherein the first workpiece is rotated by 360/N degrees between successive passes of the plurality of passes, wherein the rotation is about an axis perpendicular to the surface of the first workpiece, and wherein N is a number of the plurality of passes that are to be performed and is greater than one.

5. The method of claim 1, wherein the initial thickness profile and the updated thickness profile are measured using a reflectometer.

6. The method of claim 1, wherein the first workpiece is etched so as to achieve a thickness that is constant across the first workpiece to within a predetermined tolerance.

7. A method of etching a first workpiece, comprising:
   determining an etch rate profile of a ribbon ion beam as a function of ion beam position using a sacrificial workpiece, wherein the etch rate profile is determined by:
   measuring an initial thickness profile of the sacrificial workpiece, the initial thickness profile comprising initial thickness measurements at a plurality of locations extending in two perpendicular directions so as to yield a three dimensional array, wherein each location of the plurality of locations is a two-dimensional position on the sacrificial workpiece;
   directing the ribbon ion beam toward the sacrificial workpiece for a predetermined time or dose while the ribbon ion beam remains stationary relative to the sacrificial workpiece;
   measuring an updated thickness profile of the sacrificial workpiece after the directing, the updated thickness profile comprising updated thickness measurements at the plurality of locations; and
   determining an etch rate profile of the ribbon ion beam, wherein the etch rate profile of the ribbon ion beam is non-uniform and is calculated as a difference between the initial thickness profile and the updated thickness profile at each said two-dimensional position;
   determining an initial thickness profile of the first workpiece;
   using the etch rate profile and the initial thickness profile of the first workpiece to calculate a first set of processing parameters used to achieve a target thickness profile; and
   etching the workpiece using the first set of processing parameters.

8. The method of claim 7, further comprising:
   determining an updated thickness profile of the first workpiece after the etching;
   using the etch rate profile and the updated thickness profile of the workpiece to calculate a second set of processing parameters used to achieve the target thickness profile; and
   etching the first workpiece using the second set of processing parameters.

9. The method of claim 7, wherein the etching is performed using a plurality of passes, wherein the ribbon ion beam is scanned across an entirety of a surface of the first workpiece during each pass of the plurality of passes, and wherein the first set of processing parameters is selected from the group consisting of a number of the plurality of passes and operating parameters used during each pass.

10. The method of claim 9, wherein the etch rate profile is used to determine the operating parameters and the operating parameters are selected from the group consisting of a scan speed profile, a duty cycle of the ribbon ion beam, an extraction current, an extraction voltage, and a pressure of a feed gas.

11. The method of claim 9, wherein the first workpiece is rotated by 360/N degrees between successive passes of the plurality of passes, wherein the rotation is about an axis perpendicular to the surface of the first workpiece, and wherein N is a number of the plurality of passes that are to be performed and is greater than one.

12. A method of etching a plurality of workpieces from a lot, wherein an initial thickness profile of each of the plurality of workpieces in the lot are similar to one another, comprising:
   determining an etch rate profile of a ribbon ion beam as a function of ion beam position using a sacrificial workpiece, wherein the etch rate profile is determined by:
   measuring an initial thickness profile of the sacrificial workpiece, the initial thickness profile comprising initial thickness measurements at a plurality of locations extending in two perpendicular directions so as to yield a three dimensional array, wherein each location of the plurality of locations is a two-dimensional position on the sacrificial workpiece;
   directing the ribbon ion beam toward the sacrificial workpiece for a predetermined time or dose while the ribbon ion beam remains stationary relative to the sacrificial workpiece;
   measuring an updated thickness profile of the sacrificial workpiece after the directing, the updated thickness profile comprising updated thickness measurements at the plurality of locations; and
   determining an etch rate profile of the ribbon ion beam, wherein the etch rate profile of the ribbon ion beam is non-uniform and is calculated as a difference between the initial thickness profile and the updated thickness profile at each said two-dimensional position;
   determining an initial thickness profile of a first workpiece of the lot;
   using the etch rate profile, the initial thickness profile of the first workpiece and a target thickness profile to calculate a first set of processing parameters;
   etching the first workpiece of the lot using the first set of processing parameters; and
   etching a second workpiece of the lot using the first set of processing parameters.

13. The method of claim 12, further comprising, before processing the second workpiece:
   determining an updated thickness profile of the first workpiece of the lot after the etching of the first workpiece;
   using the etch rate profile, the updated thickness profile of the first workpiece and the target thickness profile to calculate a second set of processing parameters for the first workpiece; and
   etching the first workpiece of the lot using the second set of processing parameters for the first workpiece.

14. The method of claim 12, further comprising:
   determining an updated thickness profile of the second workpiece of the lot after etching the second workpiece;
   using the etch rate profile, the updated thickness profile of the second workpiece and the target thickness profile to calculate a second set of processing parameters for the second workpiece; and
   etching the second workpiece of the lot using the second set of processing parameters for the second workpiece.

15. The method of claim 12, wherein the etching of the first workpiece is performed using a plurality of first passes, wherein the ribbon ion beam is scanned across an entirety of a surface of the first workpiece during each pass of the plurality of first passes, and wherein the first set of processing parameters is selected from the group consisting of a number of the plurality of first passes and operating parameters used during each pass.

16. The method of claim 15, wherein the operating parameters are selected from the group consisting of a scan speed profile, a duty cycle of the ribbon ion beam, an extraction current, an extraction voltage, and a pressure of a feed gas.

17. The method of claim 15, wherein the first workpiece is rotated by 360/N degrees between successive passes of the plurality of first passes, wherein the rotation is about an axis perpendicular to the surface of the first workpiece, and wherein N is a number of the plurality of first passes that are to be performed and is greater than one.

18. The method of claim 15, wherein the etching of the second workpiece is performed using a plurality of second passes, wherein the ribbon ion beam is scanned across an entirety of a surface of the second workpiece during each pass of the plurality of second passes, and the operating parameters used during each pass of the plurality of second passes are identical to the operating parameters used for each pass of the plurality of first passes for the first workpiece.

* * * * *